United States Patent [19]

Chao

[11] Patent Number: 4,637,037
[45] Date of Patent: Jan. 13, 1987

[54] BIPHASE SIGNAL RECEIVER

[75] Inventor: Philip Chao, Skokie, Ill.

[73] Assignee: AT&T Teletype Corporation, Skokie, Ill.

[21] Appl. No.: 645,367

[22] Filed: Aug. 29, 1984

[51] Int. Cl.$^4$ .............................................. H03D 3/02
[52] U.S. Cl. ....................................... 375/87; 375/95; 375/110; 329/104
[58] Field of Search .................. 375/82, 83, 80, 84, 375/87, 110, 95; 329/104, 126; 360/42; 328/72, 75

[56] References Cited

U.S. PATENT DOCUMENTS

| | | | |
|---|---|---|---|
| 3,982,195 | 9/1976 | Turner | 329/50 |
| 4,260,952 | 4/1981 | Thomas | 329/104 |
| 4,317,211 | 2/1982 | Quesnell, Jr. | 329/104 |
| 4,513,427 | 4/1985 | Borriello et al. | 375/110 |

Primary Examiner—Benedict V. Safourek
Assistant Examiner—M. Huseman
Attorney, Agent, or Firm—W. K. Serp; A. A. Tirva

[57] ABSTRACT

The illustrated receiver 6, in flip-flops 16A–D, stores four sequential samples of a biphase-L signal A1 and shifts the samples into four shift registers 24A–D. The sampled signals are clocked through their respective shift registers 24A–D by selected phases of multiphase clock $\phi_1$, $\phi_2$, $\phi_3$, $\phi_4$. Thus, each set of four samples is stationary at some location in their respective shift registers for the same clock cycle. A decoder section 10 responds to a transition between adjacent signal levels at the output of the shift registers 24A–D and to a previously sampled signal level A44. The decoder section 10 generates a control signal A32–D32 indicating the detection of a mid-bit biphase-L signal transition. A second storage means responds to the control signal A32–D32 and stores a shift register 24A–D signal level A19, B20–D20 which occurred subsequent to the detected mid-cell transition. The control signal A32–D32 also synchronizes a recovered clock signal A14 used to clock recovered data A50 to external circuitry.

13 Claims, 6 Drawing Figures

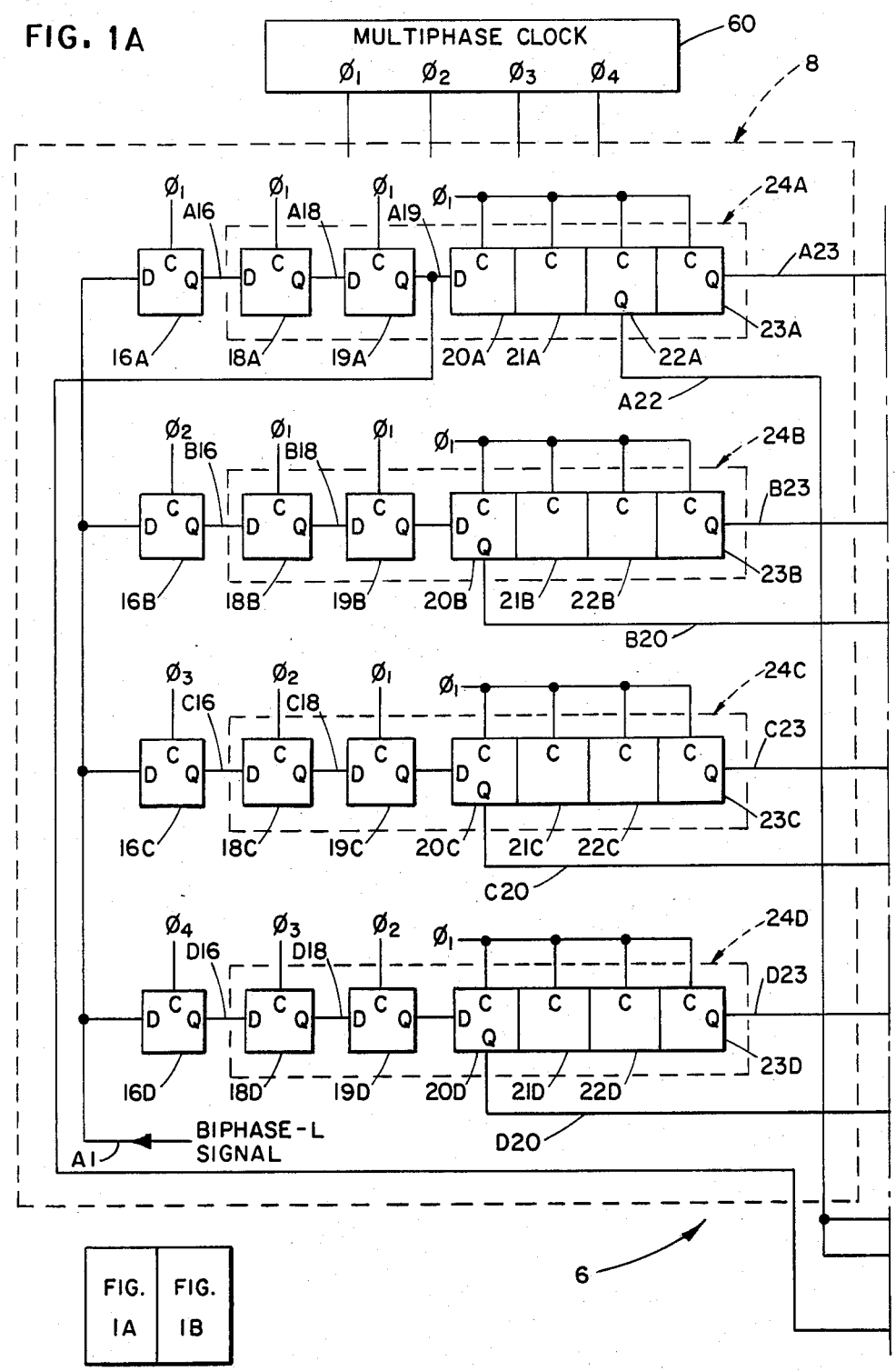

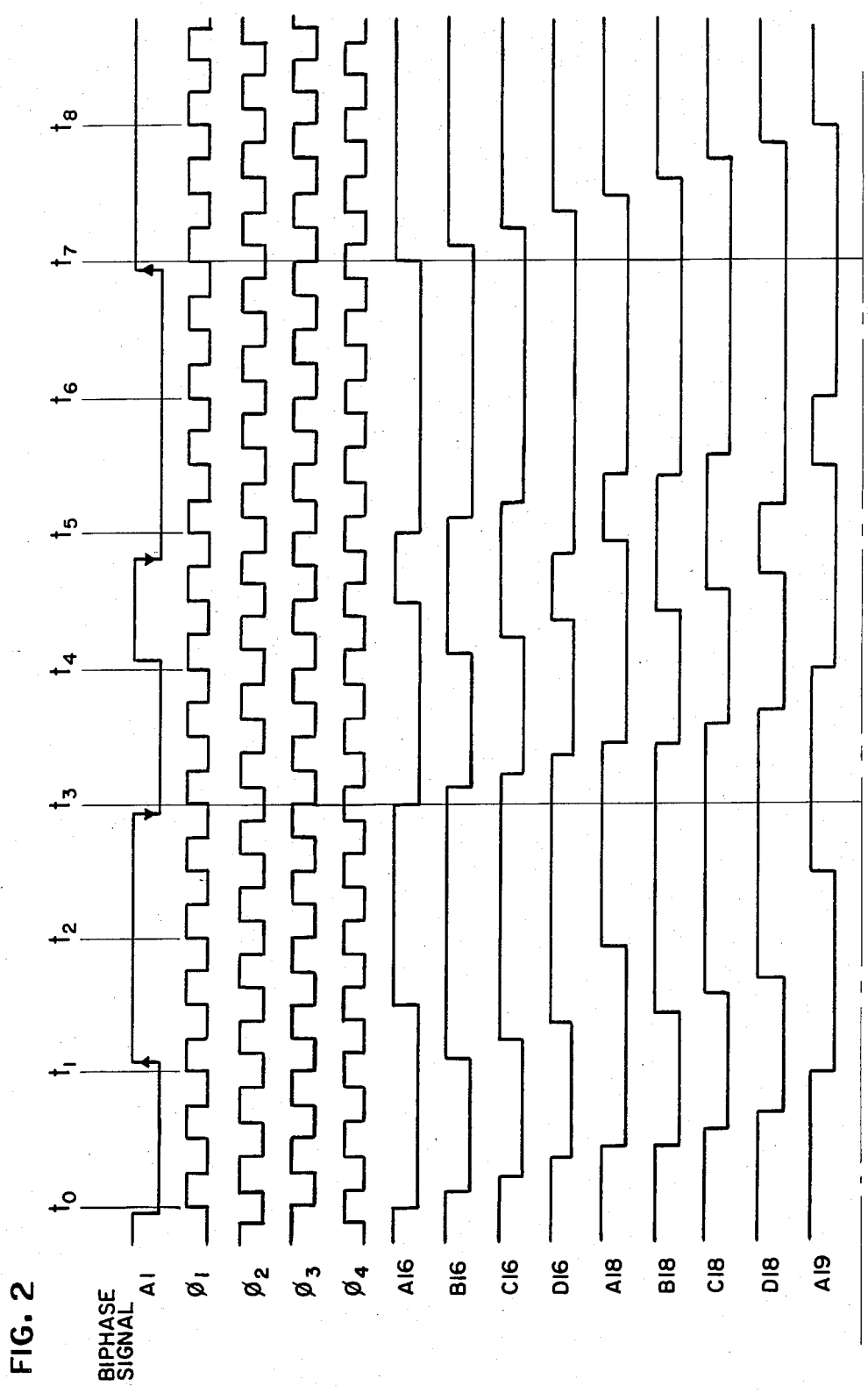

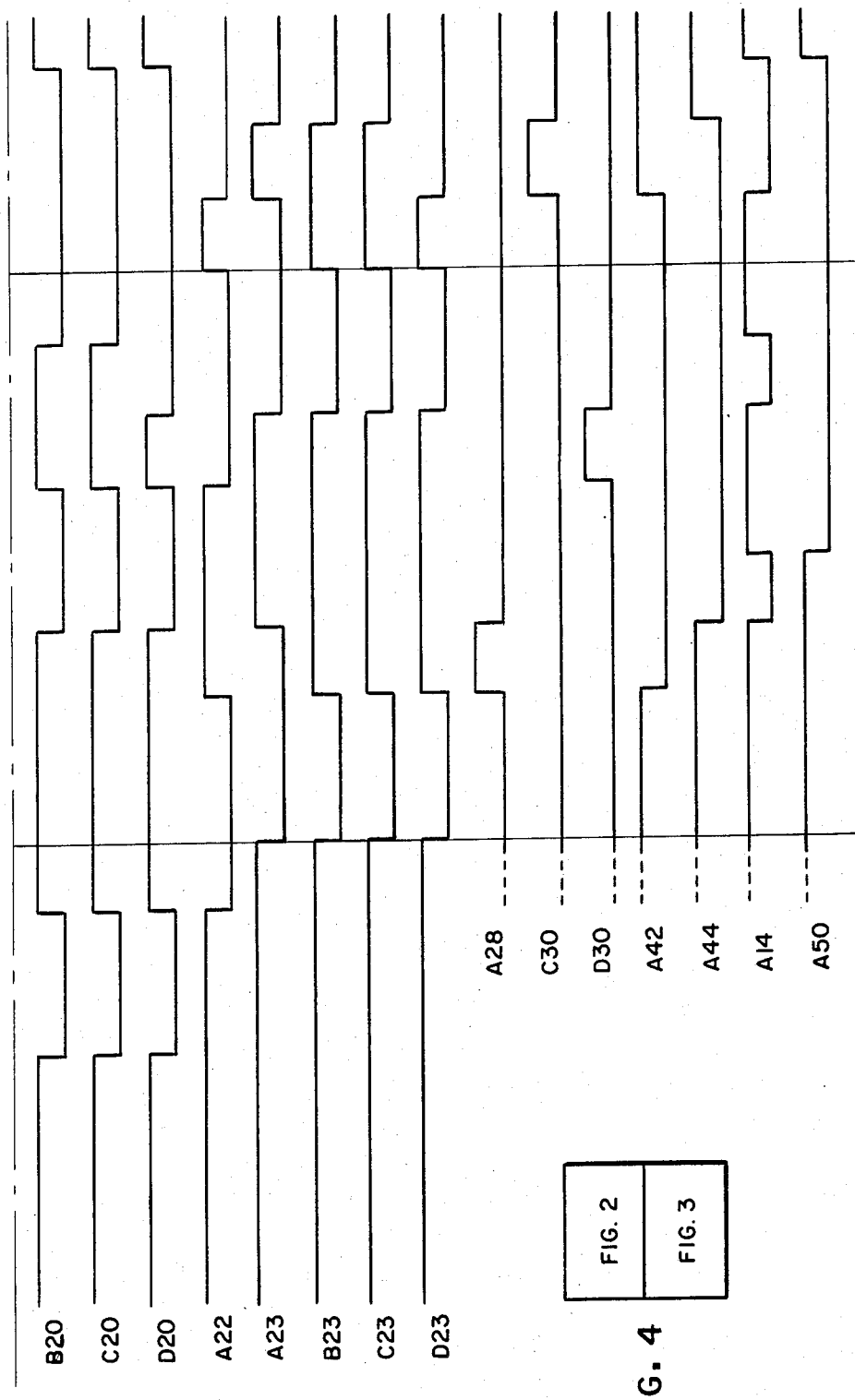
FIG. 3
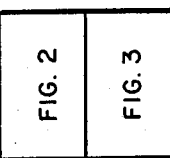

BIPHASE SIGNAL RECEIVER

TECHNICAL FIELD

This invention generally relates to a biphase signal receiver and, more particularly, to a receiver for decoding a biphase-L signal to recover clock and data information.

BACKGROUND OF THE INVENTION

A biphase signal can be conceptualized as comprising a series of cells each providing clock and data information. One type of biphase signal is the biphase-L signal wherein each cell has a mid-cell level transition providing both clock and data information. The time of occurrence of the transition provides the clocking information, and the direction of the level transition supplies the data information. For example, a mark is encoded as a positive going transition and a space as a negative going transition. It will be appreciated that a level transition will occur at a cell boundary whenever adjacent cells are encoded with the same data information. For example, two successive cells encoded with a mark signal will each have positive going mid-cell level transitions separated by a negative going cell boundary transition. The decoding circuitry for a biphase-L signal typically ignores any cell boundary transitions and responds only to mid-cell transitions. Prior biphase signal receivers are described in U.S. Pat. No. 4,567,604 Issued Jan. 28, 1986 to B. H. Jacksier and entitled "Biphase Signal Receiver" and U.S. Pat. No. 4,260,952, issued Apr. 7, 1981 to J. W. Thomas and entitled "Circuit For Decoding a Diphase Signal", both having a common assignee with this application.

Frequently, the biphase signal is distorted requiring the sampling of many segments of a bit cell to accurately decode the signal. The amount of signal distortion which a receiver can accommodate is related to the sampling rate, the greater the number of samples the more signal distortion the receiver will accommodate. Thus, the ability of a biphase receiver to accommodate distortion is directly related to the frequency of the internal clock controlling the signal sampling. Prior asynchronous biphase signal receivers have often incorporated a high frequency clock with a rate as high as sixteen times the frequency of the embedded clock of the biphase-L signal. Such high frequency signals require circuit components having very high switching speeds thereby significantly increasing the cost of the receiver.

DISCLOSURE OF THE INVENTION

In accordance with the present invention, a receiver for a biphase signal takes sequentially a plurality of samples of the biphase signal and stores them in a corresponding plurality of shift registers. The samples are clocked through their respective shift registers by selected phases of a multiphase clock so that each set of samples is stationary at some location in its respective shift register for the same clock cycle. A decoder responding to a transition between adjacent signal levels at the output of the shift registers and to a previously stored signal level generates a control signal indicating the detection of a mid-cell biphase signal transition. A data recovery section responding to the control signal stores a signal level which occurred subsequent to the detected mid-cell transition and which stored signal level will be used in the decoder along with the transitions between adjacent signal levels at the output of adjacent shift registers to detect the subsequent mid-cell transition of the biphase signal. The data recovery section generates a recovery clock signal in response to the control signal and the recovery clock signal clocks the stored signal to external circuitry.

THE DRAWINGS

FIG. 1 is a diagram illustrating the combination of FIGS. 1A and 1B;

FIGS. 1A and 1B show a circuit diagram of a biphase-L receiver incorporating certain features of this invention;

FIGS. 2 and 3 are diagrams of selected signal levels of the circuit of FIG. 1; and FIG. 4 is a diagram illustrating the combination of FIGS. 2 and 3.

DETAILED DESCRIPTION

Theory

Figure 1B:
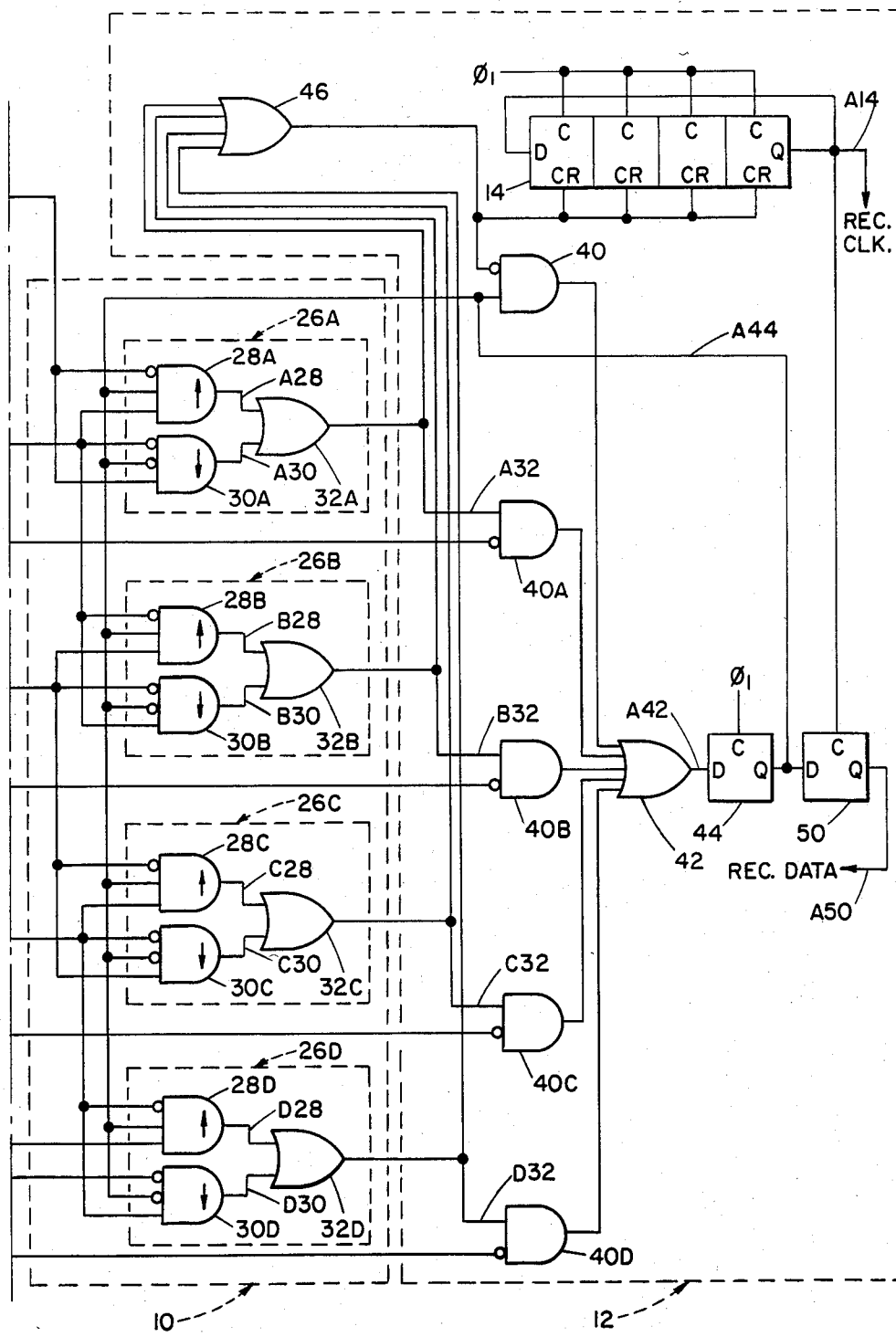

The operation of the biphase receiver 6, illstrated in FIG. 1, will be more fully appreciated after considering the composition of a typical biphase-L signal. FIG. 2 shows a sequence of four cells of a biphase-L signal A1 providing the input signal to the receiver 6. For clarity of presentation, the mid-cell transitions are shown with an arrow indicating the direction of the level transition. A mark encoded cell is followed by a space encoded cell which is again followed by a second space encoded cell with an intermediate cell boundary transition. As illustrated, the mid-cell level transitions at $t_1$, $t_3$, $t_5$ and $t_7$ provide both data and clock information. It will be appreciated that the level of the biphase-L signal immediately following a mid-cell transition corresponds to the level of the data represented by the direction of the cell transition; correspondingly, the complement of the biphase-L signal level immediately preceding a mid-cell transition directly corresponds to the encoded data level. Thus, the biphase-L signal level immediately preceeding the mid-cell transition can be stored and subsequently used to control circuitry which responds to the occurrence of the mid-cell transition and which ignores cell boundary transitions after initialization. When a mid-cell level transition is sensed, the signal level immediately preceding the next mid-cell transition is sampled. This sample level is used by the decoding circuitry to ignore any cell boundary transitions. The process is repeated for each sensing of a mid-cell transition. For example, in response to the mid-cell transition at $t_3$, the receiver 6 samples the signal level from $t_4$–$t_5$. The sample is taken as close as possible to the center of the interval to assure the greatest tolerance to input signal distortion. Since the sampled level is high, the receiver 6 will respond only to negative going transitions; and, thus, the cell boundary transition at $t_4$ will be ignored.

Circuit

Briefly, the receiver 6 includes an input section 8 for sampling and storing the level of the incoming biphase-L signal A1. As will be subsequently considered, the biphase-L signal level is sampled and stored many times during each biphase-L signal cell. The output of the input section 8 is fed to a decoder section 10 which senses the presence of a level transition at the output of the input circuit 8, and, as determined by a previously stored signal level, generates a control signal. A data recovery section 12 responds to the control signal and samples the incoming biphase-L signal level at approximately three-fourths of a biphase-L signal cell length subsequent to the sensed transition i.e. the biphase-L signal level which is stored in the input circuit 8 prior to the next mid-cell transition. The data recovery section 12 includes means, in the form of a shift register 14, for generating a recovered clock signal and for gating the sampled signal level to external circuitry in synchronization with the recovered clock signal.

The input section 8 includes four sampling type-D flip-flops 16A, 16B, 16C and 16D. The input signal A1 is connected to each of the inputs of the sampling flip-flops 16A-D and is transferred to each flip-flop output on the positive edge of one phase $\phi_1$, $\phi_2$, $\phi_3$, $\phi_4$ of a multiphase internal clock 60. The frequency of the clock signal is approximately four times the frequency of the embedded clock of the incoming biphase-L signal A1. Since the clock is four-phase, the level of each cell of the incoming signal A1 is sampled sixteen times or in four groups of four. Each sampling flip-flop 16A-D is followed by six storage type-D flip-flops 18A-D, 19A-D, 20A-D, 21A-D, 22A-D, 23A-D forming four shift registers 24A-D. All flip-flops 18A-23A, 18B-23B of the first and second shift registers 24A, 24B are clocked by the clock phase $\phi_1$. The signal B18 at the input of the second flip-flop 19B of the second shift register 24B is advanced in time with respect to the signal B16 at the input to the first flip-flop 18B by one clock phase or one-quarter of a clock cycle.

With respect to the third shift register 24C, the first flip-flop 18C is clocked by $\phi_2$, the next flip-flop 19C by $\phi_1$, and the remaining flip-flops 20C-23C also by $\phi_1$ resulting in a one-quarter cycle advance through each shift register stage for a total advance of one-half clock cycle. It will be appreciated that the maximum frequency at which any of the flip-flop components operate is 5.33 times the embedded biphase-L clock frequency while the sampling rate is 16 times the clock rate. This feature allows the components of the shift registers 24A-D and sampling flip-flops 16A-D to operate at a much slower switching speed than the sampling rate would indicate. The sample of the signal A1 is advanced by three-quarters of a cycle in the fourth shift register 24D until all four successive samples are advanced in unison by the first phase of the clock in the last four flip-flops 20A-23A, 20B-23B, 20C-23C, 20D-23D of the shift registers 24A-D. The four sampled signals in a sample group simultaneously reach the first flip-flop 20A-D of the last four stages of the respective shift register 24A-D. Thereafter each group of four successive biphase-L signal samples are advanced in unison so that they are present simultaneously in subsequent shift register stages for a full clock cycle. For purposes of discussion, a four-phase clock has been shown; however, it will be appreciated that the number of clock phases and corresponding sample flip-flops 16A-D and shift registers 24A-D as well as their relationship to the frequency of embedded incoming biphase-L clock may be varied without departing from the scope of the invention.

The decoding circuit 10 includes four transition detectors 26A-D which in response to three predetermined input conditions, drives their respective outputs high. The transition detectors 26A-D respond to the direction of the level shift between the output of adjacent shift registers 24A-D and a previously sampled biphase-L signal A1 level stored in one of the shift registers 24A-D. Each transition detector 26A-D includes two triple input AND-gates 28A-D, 30A-D followed by an OR-gate 32A-D. For example, the output of the AND-gates 28A and 30A are fed to the inputs of the OR-gate 32A. One active low input of the AND-gate 28A is connected to the direct output of the flip-flop 23A, and one direct input is connected to the output flip-flop 23B of the second shift register 24B. The remaining third input of each of the AND-gates 28A-D, 30A-D is fed by a previously stored biphase-L signal level A44 as will be subsequently further considered. Thus, when the third input signal A44 is high, the AND-gate 28A output will go high when the output A23 of the shift register 23A is low and the shift register 23B output B23 is high i.e. a positive going level transition. Similarly, when the third input signal A44 is low, the output A30 of the AND-gate 30A will go high when the output A23 of the shift register 23A is high and the output B23 of the shift register 23B is low i.e. a negative going transition. Thus, if the previously sampled signal level (the third AND-gate input A44) is high and a rising signal transition is sensed, the output of the AND-gate 28A will go high. Correspondingly, if the previously sampled signal A44 level is low, a falling edge will generate a high at the output of the AND-gate 30A. It will be appreciated that the aforementioned relationships restrict the circuit response only to mid-cell transitions and discriminate against cell boundary transitions. The output A32-D32 of each of the OR-gates 32A-D is fed to a direct input of a corresponding AND-gate 40A-D. An active low input to each AND-gate 40A-D is fed by the direct output of one of the shift register flip-flops 19A, 20B-D. The selected shift register flip-flop contains the signal level of the biphase-L signal which occurs approximately three-quarters of a cell interval after the biphase-L signal transition which is sensed by a transition detector 26A-D. As previously mentioned, this sampled level occurs prior to the next mid-cell transition i.e. approximately three-fourths of a clock cycle after the currently sensed transition. The sampling is approximately centered on the first half of the cell to afford the greatest amount of distortion tolerance and the sampled level is the complement of the data level following the next mid-cell transition. The active low inputs of the AND-gates 40A-D complement the sampled level. The output of each AND-gate 40A-D is fed to one input of a multi-input OR-gate 42 and then to the input of a type-D flip-flop 44 clocked by $\phi_1$.

The output A44 of the flip-flop 44 is also fed to a direct input of a lock-out AND-gate 40. An active low input of the AND-gate 40 is fed by the output of a second multi-input OR-gate 46. The inputs to the OR-gate 46 are connected to the output of each of the OR-gates 32A-D. These particular connections assure that the output of the flip-flop 44 will not change on the positive edge of clock signal $\phi_1$ unless one of the eight AND-gates 28A-D, 30A-D has sensed a valid mid-bit transition indicating a data level different from the previously sensed level. For example, a high output from the flip-flop 44 will allow the AND-gate 40 to follow the output of the OR-gate 46 in synchronism with the clock $\phi_1$. The outputs of the OR-gate 46, in the absence of a mid-bit transition, will be low; and, thus, the output of AND-gate 40 will be high maintaining the output of flip-flop 44 high for each cycle of $\phi_1$. Should the output of the OR-gate 46 go high, the output A42 of the OR-gate 42 will follow the sampled data level which will be latched to the flip-flop 44 output on the positive edge of the clock $\phi_1$. A low signal from the output of the flip-flop 44 will force the output of the AND-gate 40 low; and, thus, the outputs of the AND-gates 40A-D will pass directly to the input of the flip-flop 44 with the output changing in response to $\phi_1$. The clock generator 14 provides a recovered clock signal which is one-fourth the frequency of $\phi_1$ and which is synchronized with the biphase-L mid-bit transitions by signal at the output of OR-gate 46. For each output pulse from the OR-gate 46, the shift register is preset to a 0-1-1-0 configuration and is clocked by $\phi_1$. The recovered clock signal A14 is fed to the clock input of a type-D data recovery flip-flop 50, and the input of the flip-flop 50 is connected to the output of the flip-flop 44. Thus, the recovered data A50, at the output of the flip-flop 50, shifts levels in synchronization with the recovered clock signal A14.

Operation

FIGS. 2 and 3 show selected signal levels during the operation of the receiver 6 while receiving the biphase-L signal A1. The circuitry of FIG. 1 is initialized by a power-on-reset signal (not shown); and, thereafter, a preamble of continuous mark signals completes the initialization. The signal level of A1 is sampled on each positive edge of each phase $\phi_1$, $\phi_2$, $\phi_3$, $\phi_4$ of the four-phase internal clock and stored in the sample flip-flops 16A-D illustrated as signal levels A16-D16. The sampled signals A16-D16 are advanced through the shift registers 24A-D by selected clock phases in the manner previously described. The sampled signals B16, C16 and D16 are advanced in time so that they appear simultaneously at the output of the shift registers 24A-D for one full clock cycle.

During a portion of time interval $t_2$ to $t_3$, signal level A22 is low while signal level D23 is high indicating a negative signal transition between flip-flops 23D and 22A. Were it not for the fact that signal A44 is also high, the output of AND-gate 30D would go positive. This transition corresponds to the cell boundary transition at $t_0$. At $t_4$, A23 is low and B23 is high indicating a positive signal transition between the outputs of flip-flops 23A and 23B. This sensed transition, together with the high level of A44, causes the output of AND-gate 28A to go high. This high signal A28 is fed as signal A32 to the input of AND-gate 40A through OR-gate 32A. Since the high output B20 of shift register flip-flop 20B is fed to the active low input of AND-gate 40A, the AND-gate 40A output A40 will stay low. The high output A32 of the OR-gate 32A is fed through OR-gate 46 to the active low input of the AND-gate 40. The output signal A44 of the flip-flop 44 goes low at the next rising edge of $\phi_1$ following the input signal A42. The timing diagram of FIG. 4 illustrates the operation of the circuit under various biphase signal A1 conditions. A recovered mark-space data signal A50 is generated which is in synchronization with the recovered clock signal A14.

Although this invention has been particularly shown and described with reference to a preferred embodiment thereof, it will be understood that various changes in form and detail may be made without departing from the scope and spirit of the invention as set forth in the following claims.

What is claimed is:

1. A circuit for decoding a biphase signal comprising:
  a plurality of first storage means connected in parallel, for storing
  a plurality of shift registers (24 A-D), each shift registers connected to a respective output of said storage means for receiving the stored samples and thereafter advancing each sample therethrough;
  a plurality of generating means (A32-D32) Respective to a level transition between said
  samples outputted from said plurality of shift registers and a previously stored biphase signal level (A44) for generating a control signal wherein said control signal is generated from one of the said plurality of generating means (A32-D32);
  second means (44) responsive to said control signal (A32-D32) for storing a sample of the level of the biphase signal fed into one of said shift registers (24 A-D), wherein said sample to be stored occurred prior to the sample for which said control signal was generated; and
  means (14) for generating a recovered clock signal synchronized with said control signal (A32-D32).

2. The circuit of claim 1 which further includes:
  means (50) for generating a recovered data signal corresponding to the biphase signal level stored in said second storage means (44).

3. The circuit of claim 2 wherein said recovered data generating means (50) is controlled by the recovered clock signal from said recovered clock generating means (14) so that said recovered data and clock signals are synchronized.

4. The circuit of claim 2 wherein said plurality of first storage means (16 A-D) are, each clocked by a selected phase of a multiphase clock (60).

5. The circuit of claim 4 wherein said biphase signal is a biphase-L signal having mid-cell transitions providing both data and embedded clock information and selective cell boundary transitions; and
  said control signal generating means (26 A-D) generates said control signal (A32-D32) only in response to a mid-cell level transition so that said second storage means (44) stores the level of a biphase-L signal level (A19, B20-D20) which occurred subsequent to the detected transition in response to said control signal.

6. The circuit of claim 5 wherein each of said shift registers (24 A-D) include cascaded flip-flops, each of said flip-flops being controlled by a selected phase of said multiphase clock (60).

7. The circuit of claim 6 wherein successive stages of selected shift registers (24 A-D) are clocked by different ones of said clock phases so that each of said successive samples of the biphase signal is present in a stage of one of said shift registers for the same full clock cycle for the simultaneous sensing during a full clock cycle by said control signal generating means.

8. The circuit of claim 7 wherein said plurality of first storage means (16 A-D) comprises a plurality of type-D flip-flops, each of said type-D flip-flops being clocked by a different phase of said multiphase clock, each of said shift registers (24 A-D) includes a plurality of type-D flip-flops in cascade, selected type-D flip-flops of said shift registers being clocked by a different clock phases.

9. The circuit of claim 8 wherein said control signal generating means (26 A-D) comprises a plurality of logic devices, each of said logic devices is sensitive to the direction of the transition between a selected stage of each of two shift registers and to the level of a previously sampled signal stored in said second storage means.

10. The circuit of claim 9 wherein said second storage means (44) comprises a type-D flip-flop clocked by one phase of said multiphase clock.

11. The circuit of claim 10 wherein said recovered data means (50) comprises a type-D flip-flop clocked by said recovered clock signal and receives an input from said second storage means.

12. The circuit of claim 11 wherein said recovered data generating means (50) is controlled by said recovered clock generating means (44) so that said recovered data and clock signals are synchronized.

13. The circuit of claim 9 wherein said control signal generating means (26 A-D) includes a pair of AND-gates (28 A-D, 30 A-D, a first input of each AND-gate connected to a selected stage of one of said shift registers (24 A-D);

a second input connected to the output of said second storage means (44); and an OR-gate (32 A-D) receiving the output of said AND-gates and providing said control signal (A3-2-D32).

* * * * *